US 6,804,160 B2

(12) United States Patent
Schäfer et al.

(10) Patent No.: US 6,804,160 B2
(45) Date of Patent: Oct. 12, 2004

(54) MEMORY DEVICE AND METHOD OF ACCESSING A MEMORY DEVICE

(75) Inventors: Andre Schäfer, München (DE); Andrea Zuckerstätter, München (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/290,365

(22) Filed: Nov. 7, 2002

(65) Prior Publication Data
US 2003/0095462 A1 May 22, 2003

(30) Foreign Application Priority Data
Nov. 7, 2001 (DE) .......................... 101 54 505

(51) Int. Cl.[7] ................................ G11C 7/00
(52) U.S. Cl. .................. 365/227; 365/200; 365/226; 365/230.03
(58) Field of Search ............... 365/227, 200, 365/226, 230.03

(56) References Cited

U.S. PATENT DOCUMENTS

| 6,115,318 A | * | 9/2000 | Keeth .................... 365/233 |
| 6,310,815 B1 | | 10/2001 | Yamagata et al. ..... 365/230.03 |
| 6,418,068 B1 | * | 7/2002 | Raynham ................ 365/200 |
| 6,542,416 B1 | * | 4/2003 | Hampel et al. ........... 365/194 |
| 2001/0014049 A1 | | 8/2001 | Woo et al. .............. 365/200 |

FOREIGN PATENT DOCUMENTS

DE 198 37 016 A1 5/1999

* cited by examiner

Primary Examiner—Van Thu Nguyen
Assistant Examiner—Pho M. Luu
(74) Attorney, Agent, or Firm—Laurence A. Greenberg; Werner H. Stemer; Ralph E. Locher

(57) ABSTRACT

A memory device includes a memory module, a control unit and a bus connected to the memory module and the control unit. In an accessing operation of the memory module via bus, the control unit applies a first command which causes high power consumption in the memory module, to the memory module via part of the bus only.

16 Claims, 2 Drawing Sheets

MEMORY DEVICE AND METHOD OF ACCESSING A MEMORY DEVICE

BACKGROUND OF THE INVENTION

1. Field of the Invention

The present invention relates to a memory device and to a method of accessing a memory device, in particular to a memory device and to a method of accessing a memory device comprising a high-speed bus for accessing the memory.

2. Description and Related Art

A known memory system will be elucidated in more detail hereinafter by way of FIG. 1. The memory system in FIG. 1 comprises a memory module 100 having a plurality of memory elements $102_1$, $102_2$, ... $102_n$. The memory elements are, for example, DRAM memory elements. The memory system comprises, furthermore, a bus system 104 having a plurality of partial busses $106_1$ ... $106_n$, each of the partial busses having a predetermined bit width and being connected to an associated memory element, e.g. partial bus $106_1$ to memory element $102_1$, and partial bus $106_n$ to memory element $102_n$. The ends of the bus system 104 remote from memory module 100 are connected to a control unit 108 which, depending on signals received, outputs commands to the bus system 104 so as to render possible accessing of the memory module 100, or rather the memory elements $102_1$ to $102_n$ arranged in the memory module.

The memory system illustrated in FIG. 1 is a high-speed memory system operating at clock frequencies in the range from approx. 200 MHz. In particular, the memory system illustrated in FIG. 1 makes use of a high-speed memory bus system, and a problem of the arrangement illustrated in FIG. 1 arises, due to the high-speed application, in connection with the heat developing in the memory elements $102_n$. The cause of the heat development in the memory elements $102_1$ to $102_n$ is to be seen for one thing in that the memory element is effective as source, with the power consumed in the memory element, e.g. the DRAM, increasing with increasing signal frequency. The power consumed can be calculated as follows:

$$P_{Dram} = C \times f \times \Delta u^2$$

wherein:

C represents the capacitance of the control unit and the bus ($106_1$–$106_n$), $\Delta u$ represents the voltage level difference of the outer data signal, and f represents the signal or clock frequency (outer bus clock frequency).

The above equation easily shows that the power consumed in the memory element will increase with increasing signal or clock frequency.

A second cause for the development of heat in the memory element arises when the memory element is effective as receiver only. For conventional non-high-speed applications, the receiver memory element acts as input capacitance only which, however, hardly makes itself felt in the power budget. This does not hold for high-speed systems, since in that case the receiver (memory element) is provided with a terminating impedance for terminating the bus, which considerably contributes in heating the memory element, since a dc component flows through the terminating impedance when the usual driver concepts (push-pull and open-drain) are employed.

In operation, the afore-mentioned causes in connection with the heating of the memory elements in conventional high-speed memory systems have the following effect. The conventional practice in a memory system consists in reading or writing all bits of the bus 104 simultaneously via the bus, i.e. the command "READ" or "WRITE" is always applied simultaneously to the entire bus 104, as illustrated in FIG. 1 schematically for partial busses $106_1$ and $106_n$ that each have a write command 110 arranged thereon. The thermal load on the memory element is, however, different depending on whether a data bit is read from the memory element or written into the same. In case of bus systems having a terminating impedance, reading of the memory element results in little power consumption only, whereas writing of bits into the memory element is accompanied by comparatively higher power consumption.

The disadvantage of the bus systems illustrated in FIG. 1 consists in that in such conventional arrangements a command always is given to the entire memory module, so that in case of a command, e.g. the write command, the module experiences uniform/uniformly distributed heating.

There are various approaches known in the prior art for avoiding heating of the memory module. It is known, for example, that memory components comprising individual memory modules have a metallic heat spreader associated therewith for improved dissipation of heat. The disadvantage of this approach consists in that the utilization of the heat spreader for the memory module renders possible heat dissipation/heat spreading only if there is a thermal gradient present across the memory module. However, as described hereinbefore, a memory module experiences uniform heating upon application of a command to the bus, i.e. there is no thermal gradient across the memory module, so that no heat spreader can be employed that only has the area of the memory module proper. The heat spreader thus cannot be utilized for heat dissipation/heat spreading in conventional memory modules.

SUMMARY OF THE INVENTION

It is the object of the present invention to provide an improved method of accessing a memory module as well as a memory device in which undesired heating of the memory module at high clock frequencies can be avoided.

The present invention is a method of accessing a memory module via a bus, in which, during an accessing operation, a first command that causes high power consumption in the memory module, is applied to the memory module via part of the bus only.

The present invention is a memory device having a memory module, a control unit and a bus connected to the memory module and the control unit, with the control unit, during accessing of the memory module, applying a first command that causes high power consumption in the memory module, to the memory module via part of the bus only.

The present invention is based on the realization that a heat spreader having the size of the module only may me employed if it is possible to generate a thermal gradient across the module associated with the heat spreader. According to the invention, this is achieved in that commands with high power consumption are applied to part of the bus only, which in turn results in stronger heating in the portion of the module receiving this command, whereas other portions of the module are not heated to such a high extent, so that the thermal gradient across the memory module is achieved that is necessary for utilization of the heat spreader.

The heat generated in the memory module during accessing is dissipated/spread by the memory module via the heat spreader.

According to a preferred embodiment of the present invention, the memory module comprises a plurality of memory elements, and the first command is applied to part of the memory elements.

According to a further embodiment of the present invention, a second command is applied to the memory module via the remainder of the bus during accessing of the memory module, said second command causing lower power consumption in the memory module as compared to said first command.

Preferably, the first command is a write command and the second command is a read command.

Preferably, the memory module has a heat sink associated therewith in addition.

Preferably, the system according to the invention is operated at a clock frequency in the range from approx. 200 MHz.

BRIEF DESCRIPTION OF THE DRAWINGS

A preferred embodiment of the present invention will be elucidated in more detail hereinafter by way of the accompanying drawings in which.

DESCRIPTION OF THE PREFERRED EMBODIMENTS

Figure 1:
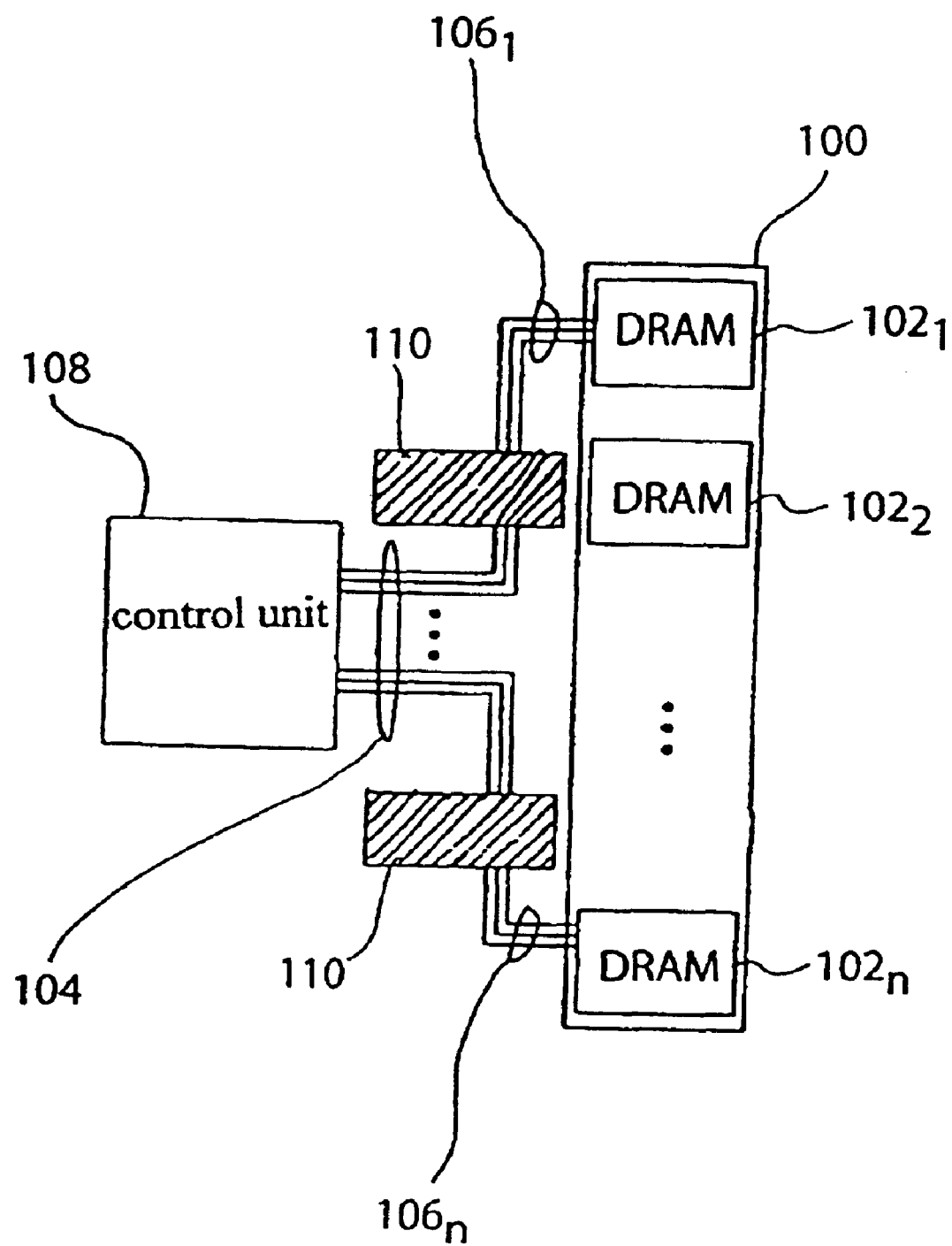
FIG. 1 shows a conventional memory system.
Figure 2:
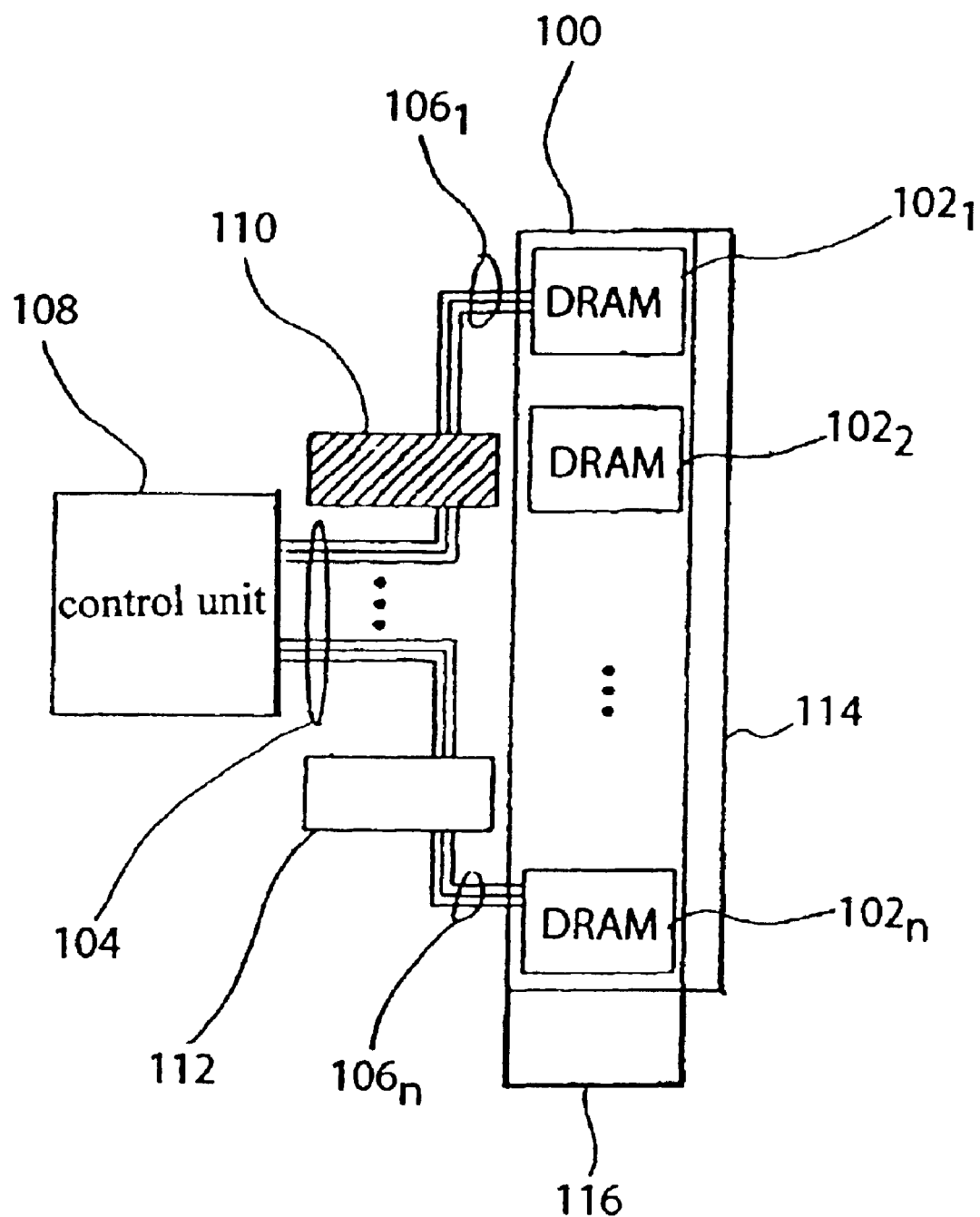
FIG. 2 shows a memory system according to an embodiment of the present invention.

FIG. 2 illustrates a memory system according to an embodiment of the present invention, in which those elements of the memory system that have already been described by way of FIG. 1 are designated with the same reference numerals and will not be described once more.

As can be seen in FIG. 2, the memory system according to the present invention corresponds in its structure in essence to the memory system described by way of FIG. 1, while however in the embodiment illustrated, the control unit 108 is effective for avoiding that, during accessing of the memory module 100, the same commands are arranged simultaneously on all partial busses $106_1$ to $106_n$ associated with the individual memory elements $102_1$ to $102_n$, so that it is avoided according to the invention that a command resulting in high power consumption in the associated memory element and, thus, in high development of heat in the entire memory module, is applied to all memory elements $102_1$ to $102_n$ simultaneously, which in turn would lead to uniform distribution of heat. According to the invention, the conventional approach described by way of FIG. 1 is abandoned, and instead, a command, e.g. the write command 110, causing high power consumption in the memory elements is applied only to part of the memory elements. By way of this measure, the development of heat in the memory module 100 is reduced. To be more precise, the portion of the memory module 100 in which the memory elements are addressed with this command is subject to higher generation of heat than the remaining portions of the memory module 100.

Furthermore, there is provided a heat spreader 114 associated with memory module 100, in order to obtain uniform heat spreading across the module utilizing the thermal gradient generated, which is required in particular in case of modules with high packing density. The utilization of this heat spreader, which in terms of size corresponds in essence to memory module 100, is rendered possible by the driving mode according to the invention only.

According to the preferred embodiment of the present invention illustrated in FIG. 2, those partial busses that do not receive the write command have a read command 112 applied thereto which, as compared to write command 110, causes low power consumption in the associated memory elements, e.g. in memory element $102_n$.

The present invention is thus based on the finding that reduction of the development of heat on the memory module can be achieved by utilization of the heat spreader due to the provision that not all bits are e.g. read/written simultaneously, but that the afore-described splitting is made in order to thus generate the necessary thermal gradient across the memory module.

In accordance with a further embodiment, there may be provided a heat sink 116 in addition for dissipating the heat from the memory module 100.

The advantage of the present invention consists in that, differently from conventional driving concepts, the splitting of the commands, e.g. the read/write commands, to partial busses of the overall bus 104 is taught for the first time. Instead of the afore-mentioned commands read/write, it is of course also possible to make available other commands to a memory module in the manner according to the invention, with these commands causing different degrees of power consumption or power input in the associated memory elements.

The embodiment illustrated in FIG. 2 shows a memory module 100 comprising a plurality of DRAMs $102_1$ to $102_n$, however, the present invention is not restricted to such memory elements, but may be applied generally to memory modules with corresponding memory elements.

In particular, the present invention may be used for high-speed applications, i.e. applications in which the memory systems operate with a clock frequency as of approx. 200 MHz. In that case, the partial busses $106_1$ to $106_n$ are terminated by terminating impedances the value of which is selected in accordance with the operating frequency or clock frequency.

What is claimed is:

1. A method of accessing a memory module via a bus, said method comprising the following step:

during an accessing operation, applying a first command that causes high power consumption in the memory module, to the memory module via part of the bus only.

2. The method of claim 1, wherein the memory module comprises a plurality of memory elements, said first command being applied to part of the memory elements.

3. The method of claim 1, comprising the following step:

during the accessing operation, applying a second command which in comparison with the first command causes less power consumption in the memory module, to the memory module via the remainder of the bus.

4. The method of claim 1, comprising the following step:

dissipating the heat generated in the memory module during the accessing operation from the memory module.

5. The method of claim 4, wherein a heat spreading element is provided for spreading heat generated in the memory module uniformly across the memory module.

6. The method of claim 1, wherein said first command is a write command and said second command is a read command.

7. A memory device, comprising:

a memory module;

a control unit, and a bus connected to said memory module and to said control unit, wherein the control unit, during accessing of the memory module, applies a first command that causes high power consumption in the memory module, to the memory module via part of the bus only.

8. The memory device of claim 7, wherein the memory module comprises a plurality of memory elements and wherein said control unit applies said first command to part of the memory elements.

9. The memory device of claim 7, wherein the control unit applies a second command which in comparison with the first command causes less power consumption in the memory module, to the memory module via the remainder of the bus.

10. The memory device of claim 7, comprising a heat spreading element associated with said memory module.

11. The memory device of claim 7, comprising a heat sink associated with said memory module.

12. The memory device of claim 7, wherein the clock frequency of the bus is in the range of more than 200 MHz.

13. The memory device of claim 7, wherein the bus is terminated by a terminating impedance that is adjusted in accordance with the clock frequency used for operating the bus.

14. The memory device of claim 7, wherein said first command is a write command and said second command is a read command.

15. A method of accessing a memory module via a bus, the method comprising the following steps:

during an accessing operation, applying a first command that causes high power consumption in the memory module, to the memory module via part of the bus only; and dissipating heat generated in the memory module during the accessing operation from the memory module.

16. A memory device, comprising:

a memory module;

a control unit;

a bus connected to said memory module and to said control unit; and a heat spreading element associated with said memory module;

said control unit, during accessing of said memory module, applying a first command that causes high power consumption in said memory module, to said memory module via part of said bus only.

* * * * *